United States Patent
Grocutt et al.

(10) Patent No.: US 9,465,690 B2
(45) Date of Patent: Oct. 11, 2016

(54) CUMULATIVE ERROR DETECTION IN DATA TRANSMISSION

(71) Applicant: ARM LIMITED, Cambridge (GB)

(72) Inventors: Thomas Christopher Grocutt, Cambridge (GB); Dall George Mathew Amos, Cambridge (GB)

(73) Assignee: ARM Limited, Cambridge (GB)

( * ) Notice: Subject to any disclaimer, the term of this patent is extended or adjusted under 35 U.S.C. 154(b) by 122 days.

(21) Appl. No.: 14/462,205

(22) Filed: Aug. 18, 2014

(65) Prior Publication Data

US 2015/0106682 A1 Apr. 16, 2015

(30) Foreign Application Priority Data

Oct. 11, 2013 (GB) .................................. 1318060.9

(51) Int. Cl.
G06F 11/10 (2006.01)
H03M 13/09 (2006.01)
H04L 1/00 (2006.01)

(52) U.S. Cl.
CPC .......... *G06F 11/1004* (2013.01); *H03M 13/09* (2013.01); *H03M 13/091* (2013.01); *H04L 1/0041* (2013.01); *H04L 1/0061* (2013.01)

(58) Field of Classification Search
CPC ............. G06F 11/1004; H03M 13/09; H03M 13/091; H04L 1/0041; H04L 1/0061
USPC ........................................................ 714/807
See application file for complete search history.

(56) References Cited

U.S. PATENT DOCUMENTS

| | | | | |
|---|---|---|---|---|
| 6,560,742 B1 | 5/2003 | Dubey et al. | | |
| 6,684,363 B1* | 1/2004 | Cassiday | ............... | H03M 13/09 714/757 |
| 6,701,478 B1* | 3/2004 | Yang | .................... | H03M 13/091 714/757 |
| 6,961,893 B1* | 11/2005 | Mukund | ............. | H03M 13/091 714/781 |
| 7,266,760 B1* | 9/2007 | Bain | .................... | H03M 13/091 714/807 |
| 7,434,150 B1* | 10/2008 | Barash | ................ | H03M 13/091 714/807 |
| 7,571,370 B2* | 8/2009 | Ridgeway | ......... | H03M 13/6516 381/22 |

(Continued)

FOREIGN PATENT DOCUMENTS

WO WO 2006/125157 11/2006
WO WO 2009/064599 5/2009

OTHER PUBLICATIONS

Search Report for GB1318060.9 dated Mar. 31, 2014, 3 pgs.

(Continued)

*Primary Examiner* — James C Kerveros
(74) *Attorney, Agent, or Firm* — Nixon & Vanderhye P.C.

(57) ABSTRACT

Circuitry for providing error check values for indicating errors in data portions within a data stream. The circuitry comprises error detecting code generation circuitry configured to apply an error detecting code algorithm to the data stream and to thereby generate and periodically update a multi-bit check value as the data stream is processed, each update of the multi-bit check value being indicative of the error detecting code generation circuitry receiving a further item of the data stream. An output for periodically outputting a fragment of the multi-bit check value from the error detecting code generation circuitry during the processing of the data stream, the fragments output each corresponding to a data portion of the data stream. Wherein each of the fragment of the multi-bit check value provides a value indicative of an error occurring either in the corresponding portion of the data stream or in an earlier portion of the data stream.

34 Claims, 7 Drawing Sheets

(56) References Cited

U.S. PATENT DOCUMENTS

| | | | | |
|---|---|---|---|---|
| 7,802,167 B1* | 9/2010 | Gorshe | ............... | H03M 13/09 714/762 |
| 8,051,359 B2* | 11/2011 | Lin | ............... | H03M 13/6508 714/757 |
| 8,261,175 B2* | 9/2012 | Wang | ............... | H03M 13/091 714/752 |
| 2004/0025105 A1* | 2/2004 | Doubler | ............... | H03M 13/091 714/781 |
| 2006/0168496 A1* | 7/2006 | Steele | ............... | H03M 13/09 714/758 |
| 2008/0148135 A1 | 6/2008 | Hughes et al. | | |
| 2008/0229174 A1* | 9/2008 | Miranda | ............... | H03M 13/091 714/758 |
| 2008/0307288 A1* | 12/2008 | Ziesler | ............... | H03M 13/091 714/758 |

OTHER PUBLICATIONS

International Search Report and Written Opinion dated Oct. 24, 2014 in PCT/GB2014/052476, 14 pages.

Y. Chuang et al, "An Almost Overhead-free Error Control Scheme for IEEE 802.16-based Multi-hop Networks" IEEE GLOBECOM 2009 proceedings, Nov. 2009, 6 pages.

Y. Chuang et al, "Investigate Partial CRC-32 Characteristic and Performance for Real-time Multimedia Streamings in 802.11 Wireless Mesh Networks" IEEE International Conference on Systems, Man, and Cybernetics (SMC), Oct. 2011, pp. 3415-3420.

* cited by examiner

CUMULATIVE ERROR DETECTION IN DATA TRANSMISSION

This application claims priority to GB Patent Application No. 1318060.9 filed 11 Oct. 2013, the entire content of which is hereby incorporated by reference.

The present technique relates to the field of data transmission and in particular to detecting errors in data transmitted between two data processing apparatus.

During the transmission of data, errors may arise and it is known to use redundancy codes such as cyclic redundancy check or CRC codes to detect these errors. Such codes are generated from the data using a same algorithm at both the transmitting and receiving devices and if the code generated at the receiver does not match that transmitted from the transmitter then one can conclude that an error has arisen in either the received data or the received code.

The CRC codes may be generated from the entire data of one data transmission to verify that entire data transmission. However, a drawback of this is that errors can only be detected after the entire data has been received. This introduces delays and requires significant buffering of the data. An alternative approach is to generate such codes from portions or packets of a data stream, this allows the data to be continually checked and errors to be spotted early.

The CRC codes may be generated from the data alone or they may be generated in a cumulative manner from the data and a previous CRC code. That is the cumulative CRC code in a data packet may be based on the data in that data packet and the CRC code from the previous packet. As well as offering protection against corrupted packets this also allows missing data packets to be detected.

In such a system, a high degree of protection can be achieved even if only a single CRC bit is transmitted per packet because each packet also benefits from the CRC protection in all subsequent packets, thus, if there are no subsequent packets, 1 bit CRC coverage will give you a 1 in 2 chance of an error not being detected, however as the number of subsequent packets increases the probability of not detecting an error quickly falls. Thus, 3 subsequent packets will give you a 1 in 16 chance of an error not being detected and 7 subsequent packets only a 1 in 256 chance of an error not being detected.

A disadvantage of this is that the last few packets have no or a small number of subsequent packets and thus, have lower protection.

Clearly there is an overhead in generating and transmitting these codes, and in some cases only a portion of the CRC code may be transmitted thereby reducing the data transmission overhead. Where cumulative CRCs are used a high level of protection can be obtained even where a single CRC bit is transmitted per packet as each packet will benefit from the CRC protection in all subsequent packets. Such a technique is disclosed in "Investigate Partial CRC-32 Characteristic and Performance for Real-time Multimedia Streamings in 802.11 Wireless Mesh networks" by Chuang et al. IEEE 2011 pages 3415-3420.

The cumulative approach to generating CRCs requires the embedding of the CRC from the previous packet within the data of the next packet prior to generating the CRC from this packet. This can be done relatively efficiently in software, however, for hardware implementations there is an increased hardware cost, along with longer timing paths and/or additional clock cycles of latency between packets to compute the CRC. One example of this would be a burst write operation on a debug interface, where each 32 bit word is treated as a packet with its own partial CRC.

It would be advantageous to be able to generate CRC codes for detecting errors in a data stream without incurring too high a hardware or transmission bandwidth cost.

Viewed from a first aspect, the present technique provides circuitry configured to error check values for indicating errors in data portions within a data stream comprising:

error detecting code generation circuitry configured to apply an error detecting code algorithm to said data stream and to thereby generate and periodically update a multi-bit check value as said data stream is processed, each update of said multi-bit check value being indicative of said error detecting code generation circuitry receiving a further item of said data stream;

an output configured to periodically output a fragment of said multi-bit check value from said error detecting code generation circuitry during said processing of said data stream, said fragments output each corresponding to a data portion of said data stream; wherein each of said fragment of said multi-bit check value provides a value indicative of an error occurring either in said corresponding portion of said data stream or in an earlier portion of said data stream.

The present technique recognises that although the cumulative generation of error detection codes increases error protection without increasing unduly the amount of data transmitted. It also recognises that if this cumulative generation requires the input of a previously calculated error correction code before the next one can be generated, then this is difficult to apply to serial data unless one runs the error detection code calculation faster than the data is output.

The present technique has addressed this by providing error detecting code generation circuitry that continually updates a check value as data items are received such that it operates at the same clocking speed as the data stream and it periodically outputs a fragment of the multi-bit check value corresponding to a received data portion, this fragment providing an indication of an error in this or a previous data portion. In this way the check value is continually calculated and a portion of a snapshot of this calculation is taken as the fragment and this will provide an indication of an error in the corresponding data portion or a previous data portion. The fragment provides an indication of the error in that it can be used in a later calculation performed by an error checking circuit to identify an error in the transmitted data.

In this way early detection of errors in a data stream is enabled without having to wait for the entire stream to have been transmitted. Furthermore, in the event of an error being detected retransmission of the data can be performed at or close to the where the error occurred rather than having to retransmit the entire data stream from the start.

This way of generating check values is particularly efficient for data streaming/burst systems, which allow a single error code check algorithm to be run over the entire data with early detection of errors being possible by taking snapshots of the partially computed code.

In some embodiments said data stream is input to said error detecting code generation circuitry as a serial stream comprising said data portions, one data portion being input directly after a previous data portion in said data stream.

Inputting the data stream as a serial stream without the need to intersperse it with previously calculated check sum values allows the calculation to be performed at the same speed as the data stream is received, making it particularly appropriate to hardware systems.

In some embodiments said error detecting code algorithm comprises a cyclic redundancy check algorithm, and said error detecting code generation circuitry comprises cyclic redundancy check generation circuitry.

Although errors can be detected using a number of different algorithms, this technique is particularly suitable for cyclic redundancy check or CRC algorithms. In this regard CRC algorithms are easy to implement in hardware, easy to analyse mathematically and good at detecting errors arising due to noise.

In some embodiments, said data stream comprises one of: a burst of data and a continuous stream of data.

The burst of data may contain a sequence of data packets or a single data packet. The data may be divided into data portions with error code fragments generated for the data portions or they may form a single data portion. In the latter case, where a single packet is transmitted then following this, a request for the full error code may be transmitted to increase the amount of error detection provided. This allows the present technique to be performed in the same way irrespective of whether a single data packet, or a number of data packets are transmitted, thus reducing the complexity of the hardware.

In some embodiments, said fragment comprises a single bit, while in other embodiments it comprises several bits.

As noted previously the degree of accuracy that can be determined from the fragment may depend on the number of bits transmitted. However, transmitting more bits increases the overheads of the system. Where a fragment of the error code is transmitted which provides an indication of an error in both the current data portion and previous data portions, then where there are a significant number of data portions then a single bit may be sufficient, particularly if at the end the full code is transmitted to reveal any errors in later portions which will not have the benefit of the cumulative system.

In some embodiments, said error detecting code generation circuitry, comprises serially connected synchronous logic circuits configured to process said data stream, said error detecting code generation circuitry further comprising a data input configured to receive said data stream and at least one feedback circuitry, said at least one feedback circuitry being configured to feedback a value output from one of said serially connected synchronous logic circuits to an input of at least one of said serially connected synchronous logic circuits closer to said data input such that said value is combined with said data stream during said processing, said fragment being output from an output of at least one of said serially connected synchronous logic circuits.

One way of providing a cumulative check that indicates an error in both the corresponding data portion and previous data portions is to use feedback circuitry to feedback a value from the serially connected logic circuits, in some cases from the output of this circuitry such that it is combined in a continual manner with the data stream. The values are thus, continually calculated from the data stream and previous check values and the fragment that is output is a snapshot of this calculation.

In some embodiments, said data stream comprises a burst of data and said error detecting code generation circuitry is configured to output said complete multi-bit check value having processed said burst of data.

As noted previously this cumulative approach to error detection allows each fragment to provide an indication of an error in the current data portion and in earlier portions. A drawback of this is that the degree of error protection in the later portions is not as high as in the earlier portions. This can be addressed by outputting the complete multi-bit check value at the end, such that a complete check of the data can be performed. In this way a fully accurate check is made with the ability to generally spot any errors occurring early in the data stream before this full error check value is calculated and sent.

A second aspect provides a data processing apparatus comprising circuitry according to a first aspect and an input port configured to receive data comprising said data stream and an output port, wherein said data processing apparatus is configured in response to receipt of said data stream at said input port to generate said fragments of said multi bit check value and to output said fragments of said multi bit check value at said output port.

In some cases, the data processing apparatus may receive the data stream and generate the multi-bit check values and output these. Thus, the apparatus that transmitted the data stream can verify whether the receiver received the data correctly from the multi-bit check values that it receives. These multi-bit check values are periodically output by the receiving apparatus during receipt of the data stream and indicate an error in the portions so far received, thereby allowing early detection of any errors. The input may be part of a dual input/output port or it may be configured as a single port.

In some embodiments, said circuitry further comprises buffer circuitry configured to store said data portions of said data stream; and control circuitry configured to commit a least recently received stored data portion in response to receiving a further data portion.

Due to the cumulative nature of the calculation the more fragments output subsequent to a data portion that do not indicate errors, the more likely it is that this data portion is correct, thus, committing the least recently stored data portion in response to receiving further data portions means that the data portion that is currently stored and that least likely to have an error in it is committed.

In some embodiments, said control circuitry is configured to vary a number of data portions that are stored in said buffer at any one time in dependence upon a desired error detection capability.

The size of the buffer required depends on the required accuracy and in fact can be varied according to circumstances and current accuracy requirements. This allows the system to be configured according to circumstance such that where appropriate some storage can be freed for other purposes if the accuracy required means that less data needs to be buffered.

In some embodiments, said control circuitry is configured to respond to receipt of an error indication received at said input port to flush said buffer circuitry of said data portions.

As in this embodiment error check values are generated in the circuitry receiving the data and are transmitted to the circuitry transmitting the data with any error being identified there, then the receiving apparatus is only aware of any error, when it receives an error indication from the transmitter. If such an error indication is received then the buffer in the receiving apparatus that is storing the data prior to committing is flushed.

In some embodiments, said data stream is received at said input port from a data interface, and said error indication comprises no activity on said data interface for a predetermined time.

One convenient way of indicating that there is an error in the data stream is to pause transmission of any data at the transmitter that has detected the error. Thus, the receiving apparatus will see no activity on the data interface for a predetermined time. In this regard, transmitting error signals require these signals to have a particular encoding which takes up encoding space. Such error signals would also require error protection such that an error in the transition of an error indication can't result in corrupted data being committed. In an embodiment where the data stream is transmitted periodically one can indicate the detection of an error by simply not transmitting any data for a predetermined time. In such an embodiment, receipt of new data portions at the data receiver is an indication that earlier data portions are correct and therefore an indication that data can be committed from the buffer. Since the number of corrupted packets will be relatively low, as such pausing the transmission of data in the event of an error will not represent a significant overhead.

In some embodiments said control circuitry is configured to respond to receipt of an acknowledgement indication received at said input port to commit and flush said buffer circuitry of said stored data portions.

Where the sending of a set of data is complete, this may be indicated by an acknowledgement indication being received from the apparatus sending the data, in response to this the buffer is committed and flushed, as at this point the error code detection will start again on a new data set.

In some embodiments said data stream comprises a burst of data and said acknowledgement indication comprises receiving a further burst of data on said input.

Where the data stream is sent as data bursts, then the receipt of a new data burst indicates that the previous data burst has been sent and the code detection is starting again. At this point the buffer should be committed and flushed as any subsequent error indications will not apply to the data currently stored in the buffer.

In some embodiments, said circuitry is configured to identify a data item received at said input port as a request for said complete multi-bit value from an indicator associated with said data item and to respond to said request by outputting said multi-bit check value.

As the error codes are generated by the receiver of the data then it will not know when a data burst for example has completed. Thus, it may be advantageous if the data transmitter transmits at the end of a burst or at the end of a data stream that it has finished and it now requires the complete multi-bit value. This can be indicated by an indicator and the receiving apparatus can respond to this by outputting the required value.

In some embodiments said input port is further configured to receive data transactions and said output is further configured to output a stream of data comprising said data stream and said fragments of said multi-bit check values and said multi-bit check value in response to one of said data transactions.

A data processing apparatus may be configured to both receive data and to output data in response to data transactions. In the data output case the fragments of the multi-bit check value will be output with the data followed by the complete multi-bit check value at the end of the data stream.

In some embodiments said data processing apparatus is configured to output said data stream as a plurality of said portions of said data stream interspersed by said corresponding fragments of said multi-bit check value and followed by said multi-bit check value.

It is advantageous if the data stream that is output is interspersed with the fragments and the multi bit check value is output at the end. In this way, as the data portions are received they can be checked with the fragments to determine errors early and a complete check can be performed at the end with the complete value.

In some embodiments said data processing apparatus is configured to control said circuitry to output an incorrect fragment of said multi-bit check sum value in response to said data stream receiving apparatus not being able to process at least a portion of said data stream.

If there is an error in the transmission of the data for some reason then the data receiver can indicate this by purposely outputting an incorrect fragment of the multi bit check value. In response to this the system will assume an error in transmission and retransmit the data. Some systems may query the receiving apparatus to determine the nature of the error, and therefore whether retransmission is likely to be successful, or whether the error is permanent, for example an invalid request.

In some embodiments, said fragment of said multi-bit check value comprises a single bit value, said data processing apparatus comprising output circuitry configured to generate a two bit value from said single bit prior to outputting said fragment, said two bit value comprising two bits each having a different value and having either a rising or falling edge between said two bits, said rising or falling edge being synchronised with a clock signal clocking said data processing apparatus.

Although it may be advantageous to output a single bit of the multi bit check value, in some embodiments, it may be advantageous to convert this single bit value to two bit value and use the transition between the two values not only as an indicator of the value but also as an indicator of a clock signal such that the receiver of this value can be synchronised to the clock signal of the transmitter of this value and does not need to have a shared clock signal but can generate a clock signal from this transition. This reduces the number of connections that may be required between the two devices.

A third aspect provides a data processing system comprising a data processing apparatus according to a second aspect and a further data processing apparatus configured to output said data stream to said data processing apparatus wherein said further data processing apparatus is configured to receive said fragments of said multi-bit check value and in response to detecting an error to transmit an indication of said error.

An aspect provides a system having data transmitter that transmits the data and a receiver that receives it, generates the multi-bit check value and outputs fragments thereof, the transmitter detecting errors in transmission from these values and provides an error indication. In some cases the error indication is provided by pausing the transmission of data for a predetermined time.

In some embodiments said further data processing apparatus comprises a clock generator for generating a clock signal from a received clock signal, wherein said fragments of said multi-bit check value that are received each comprise a two bit value having two different bits and either a rising or falling edge between said two bits, said clock generator being configured to adjust said clock signal to synchronise said clock signal with at least some of said rising or falling edges.

Where the data is transmitted between devices, synchronisation of the devices can be obtained by encoding the value as a transition between two values. Such a transition can be used as a synchronising clock edge and in this way both the value and a synchronising signal are sent. Furthermore, there is no need to provide a shared clock common to both receiver and transmitter.

In some embodiments said further data processing apparatus is configured to output a read request to read a status register of said target device in response to detecting an error in one of said received fragments of said multi-bit check value.

Where an error is detected in one of the received fragments then it may be advantageous if the further data processing apparatus transmits a read request to read a status register of the target device to determine if there is some error that has occurred that can be identified by the status register. In the case that a false fragment has been output by the receiving device to indicate an error in receiving data then this can identify the cause of the failure. As errors are infrequent there is not much overhead by performing this action in response to detecting an error.

In some embodiments said further data processing apparatus comprises a debugging apparatus and said data processing apparatus comprises a microprocessor to be debugged.

The present technique is particularly suited to debugging apparatus where debug data and transactions are sent to a microprocessor. Gate count is often a critical factor for microprocessor. When being debugged they must buffer the data received until they are confident that it is correct, as if this buffering were not present then invalid data could be written to write sensitive peripheral registers in the system. Similarly if a burst containing an error was retransmitted from the beginning rather than close to where the error occurred, write sensitive peripherals would see duplicate writes. The use of the present technique allows the amount of buffering to be reduced without limiting the maximum length of a burst.

A fourth aspect comprises a data processing apparatus comprising circuitry according to a first aspect, said circuitry further comprising: an output configured to output a stream of data comprising said data stream and said fragments of said multi-bit check values and said multi-bit check value.

In some embodiments it may be the transmitting apparatus that has the circuitry and that outputs the data and the check values.

In such a case the data processing apparatus may be configured to output said data stream as a plurality of said portions of said data stream interspersed by said corresponding fragments of said multi-bit check value and followed by said multi-bit check value.

Outputting the data in this way allows the data received to be checked continually and any errors spotted early.

A fifth aspect provides a data processing system comprising a data processing apparatus according to a fourth aspect and a further data processing apparatus in communication with said data processing apparatus and comprising an input for receiving said data stream and said multi-bit check value and error detecting circuitry configured to check for errors in said received data stream in dependence upon said data stream and said fragments of said multi-bit check value and in response to detecting an error providing an error indication to said data processing apparatus.

A sixth aspect provides a method for providing error check values for indicating errors in data portions within a data stream comprising the steps of:

generating an error detecting code by processing said data stream by applying an error detecting code algorithm to said data stream and thereby generating and periodically updating a multi-bit check value as said data stream is processed, each update of said multi-bit check value being indicative of said error detecting code algorithm being applied to a further item of said data stream;

periodically outputting a fragment of said multi-bit check value during said processing of said data stream, said fragments output each corresponding to a data portion of said data stream; wherein each of said fragment of said multi-bit check value provides a value indicative of an error occurring either in said corresponding portion of said data stream or in an earlier portion of said data stream.

A seventh aspect provides a computer program product comprising a computer program operable when executed by a data processing apparatus to control said data processing apparatus to perform steps in a method according to a sixth aspect.

In this regard although the present technique can be embodied in hardware, the generation of the error checking values may also be done in software.

BRIEF DESCRIPTION OF THE DRAWINGS

The present technique will be described further, by way of example only, with reference to embodiments thereof as illustrated in the accompanying drawings, in which.

DESCRIPTION OF EXAMPLE EMBODIMENTS

Figure 1:
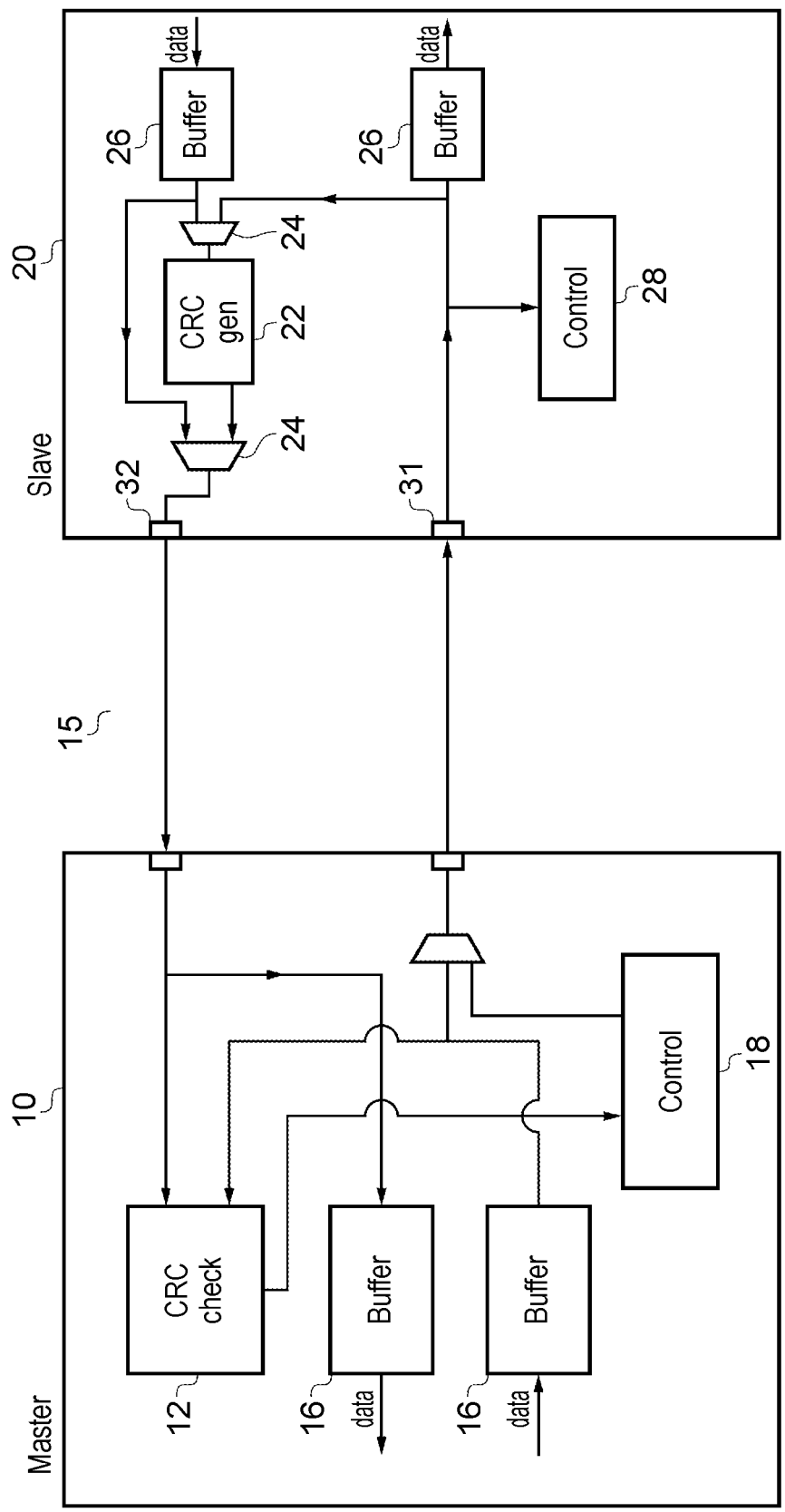
FIG. 1 shows a data processing system according to an embodiment.

FIG. 1 shows a data processing system according to an embodiment. The data processing system comprises a master 10 and a slave 20 in data communication with each other. The communication is shown as being via an interface 15 and this interface may take the form of a physical bus or other wired connection or it may be a wireless connection. In this embodiment, master 10 generates transactions which it transmits to slave 20.

Slave 20 has cyclic redundancy check generation circuitry 22 which generates a multi-bit cyclic redundancy check value from data that it receives. It does this using circuitry which generates a polynomial algorithm and this circuitry is shown in more detail in FIG. 3. The circuitry has at least one feedback loop, such that at least some of the code that is generated is fed back into the circuitry so that cumulative error detection codes are formed. The circuitry has an input and an output and as data is received the code generated is updated.

In this embodiment, when the master is performing a write for example, a fragment of the code generated by CRC generator 22 is output periodically as the data is received. This fragment can be used to identify any error that might be present in the received data. At the end of a data transaction the master 10 will transmit an indicator along with the final piece of data indicating that this is the end of the transaction and in response to this control circuitry 28 will control the slave 20 to output the full multi-bit CRC code, such that the final pieces of data can be rigorously checked.

In addition to CRC generator circuitry 22 and multiplexer 24 there is also a buffer 26 within slave 20 for storing the received data before it is committed and written to the required addresses. In FIG. 1 two buffers are shown one for read data and one for write data, depending on the implementation these buffers may be implemented as separate buffers or as a single buffer. There are also input and output ports 31 and 32 which in this embodiment are shown as separate ports but in some embodiments will be a single port with both input and output functionality.

During a write the master will transmit a string of data and during this transmission will start to receive back the CRC fragments corresponding to data portions already sent that have been generated by CRC code generation circuitry 22. It will create its own corresponding CRC fragments using corresponding CRC check circuitry 12 from the data it transmitted and will use these to verify whether the CRC fragments it receives are the expected ones or whether the CRC fragments indicates an error.

The data received in the slave is buffered in buffer 26 that in this embodiment is the buffer that receives the write data and receipt of new data is taken as an indication that the previous data received was correct, so when new data is received the oldest data stored in buffer 26 is committed. If an error is detected by the master 10 then this is indicated to the slave and the buffer is flushed and the data is retransmitted from a point at or close to where the error was detected.

In this embodiment, the slave always generates the CRC code and the master checks it. The CRC checking circuitry 12 may be a CRC generator similar to that of the slave and comparison circuitry not shown such that the data is used to generate the CRC code as it is in the slave and then the CRC code generated is compared to that received from the slave. Alternatively, it may be some other circuitry which can receive the CRC codes and data and generate an error indication from the two.

As in this embodiment, the CRC code is always generated within slave 20 then the functionality of this system depends upon whether the master sends a write or a read transaction. This is illustrated schematically in FIGS. 2a and 2b respectively.

Figure 2A:
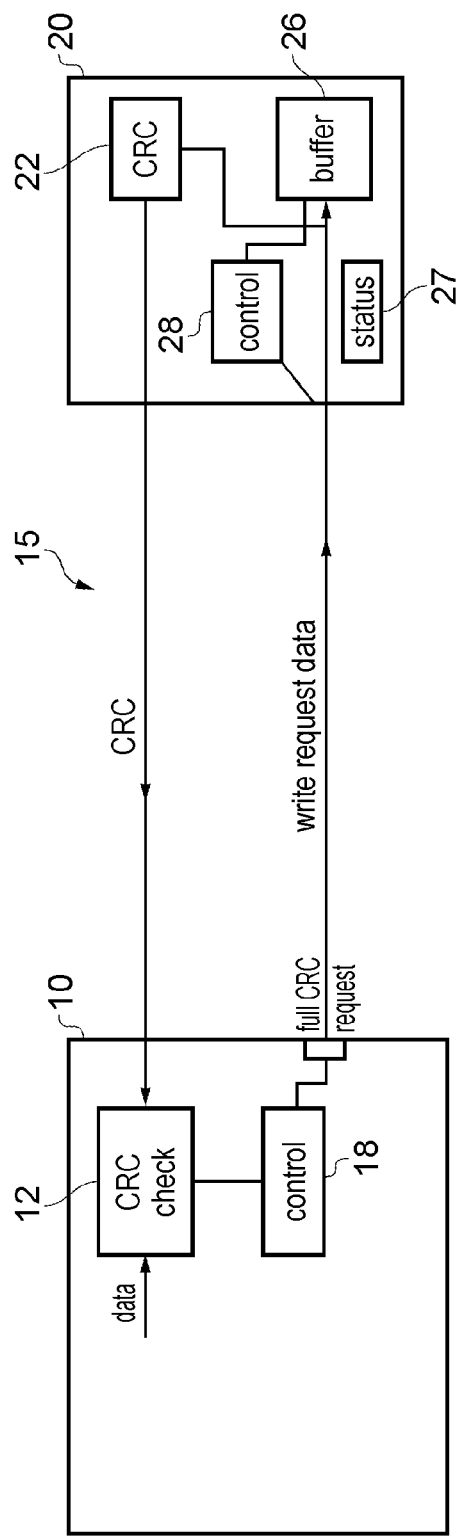
FIGS. 2a and 2b show the data processing system of FIG. 1 performing a write and read respectively.

FIG. 2a shows circuitry similar to that of FIG. 1 with the master 10 transmitting a write request and data to the slave 20. The slave 20 receives the data and buffers it within buffer 26. CRC generation circuitry 22 generates CRC codes and will transmit fragments of the code back to the master 10. This happens while the data is being received. Thus, the data and CRC codes are interleaved in time although they are travelling in different directions.

In the case that the interface is a single wire rather than a bi-directional interface, then the data will travel in one direction and the CRC code intermittently travelling back. Control circuitry 28 will check for the arrival of new data portions and if they arrive at the expected time they will be saved in the buffer and the oldest data portion already within the buffer will be committed. In this regard, as the CRC check is a cumulative check the more subsequent data portions that are received the more sure you can be that the older portions are correct, as each CRC code provides an indication not only of the correctness of the current data portion but also of the correctness of the previous data portions. Thus, as the number of CRC codes received increases then the probability of there being no errors in the earliest received data portions also increases. Thus, the larger the buffer the more subsequent data portions are received before committing a data portion and the higher the reliability of the committed data. The buffer size is therefore selected depending on the error detection confidence one requires.

Master 10 transmits the write request and the data and it received the CRC fragments back from the slave 20 and checks them using CRC check circuitry 12. If it detects an error then control circuitry 18 will signal this error to slave 20 by not transmitting further data for a predetermined period. Control circuitry 28 will respond to a pause in the activity on the interface 15 by flushing buffer 26. Control circuitry 18 will then re-transmit the write request and the data. In some embodiments it may generate a read request to read a status register 27 to determine whether there is a fault on the slave of which it should be aware. In this regard, the slave 20 may on occasion generate a false CRC code to indicate an error to the master, where it cannot receive the data correctly, perhaps due to a fault occurring within the slave 20.

When the full write request has been transmitted then a full CRC request is transmitted by control circuitry 18 which indicates to the slave that all of the data has now been received and can the full CRC be output. In response to this the slave 20 it will output the full CRC of the data of that particular write request.

A new request will then be sent and control circuitry 28 will commit the contents of buffer 26 in response to receiving the new request.

Figure 2B:
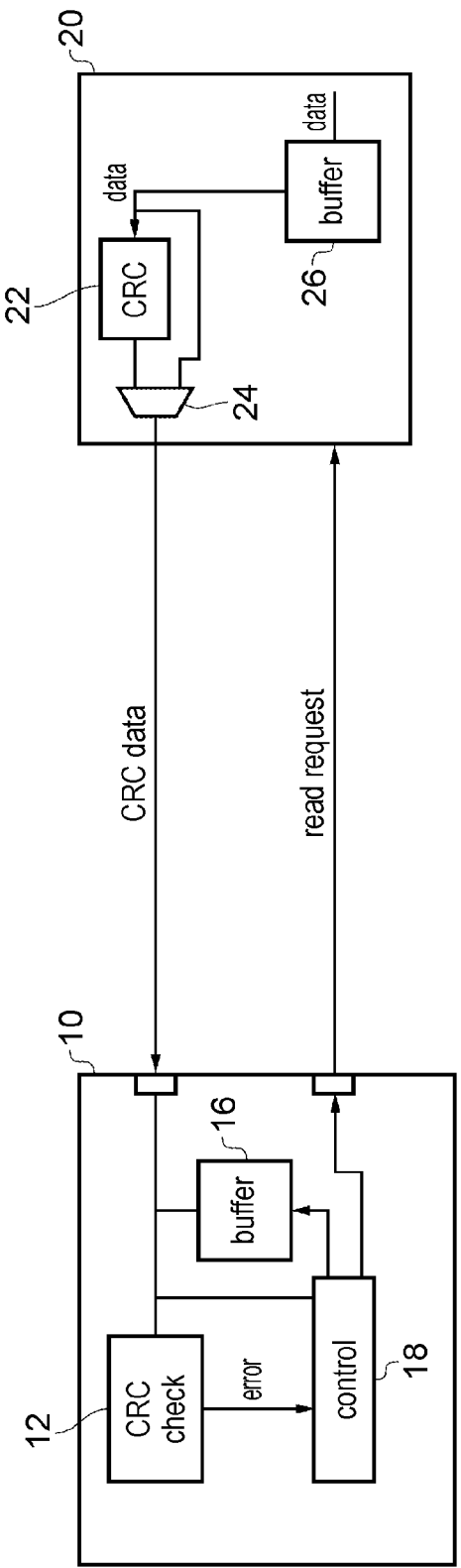

FIG. 2b shows what occurs when a read is implemented. Thus, in this case, a read request is sent from master 10 to slave 20 and CRC generation circuitry generates the CRC fragments and outputs the read data with the CRC fragments interleaved within it using multiplexer 24. At the end of the data output the full CRC code is output. In this case, data that is stored in the buffer 26 is the data that is read and it is stored in the buffer in case there is an error in its transmission so that it can be re-transmitted again. Thus, in this case, if there is an error detected the buffer is not flushed. It is only when the data has been successfully transmitted that it can be flushed.

The CRC fragments and the data are received at master 10 and the data is buffered within buffer 16. The data is then input to the CRC check circuitry 12 along with the CRC fragments and it is determined if the CRC fragments generated from the received data match those that have been received. If they do not then an error signal is sent to control circuitry 18 which flushes the buffer 16 and re-submits the read request. If no error is detected then the request is successful. As each new piece of data is received and no error is signalled then the oldest pieces of data in the buffer 16 are committed. When the full CRC code has been received and it indicates that all of the data received is correct then the control circuitry 18 may commit the whole of the buffer 16. Alternatively, it may do this in response to generating a new transaction request.

Figure 3:
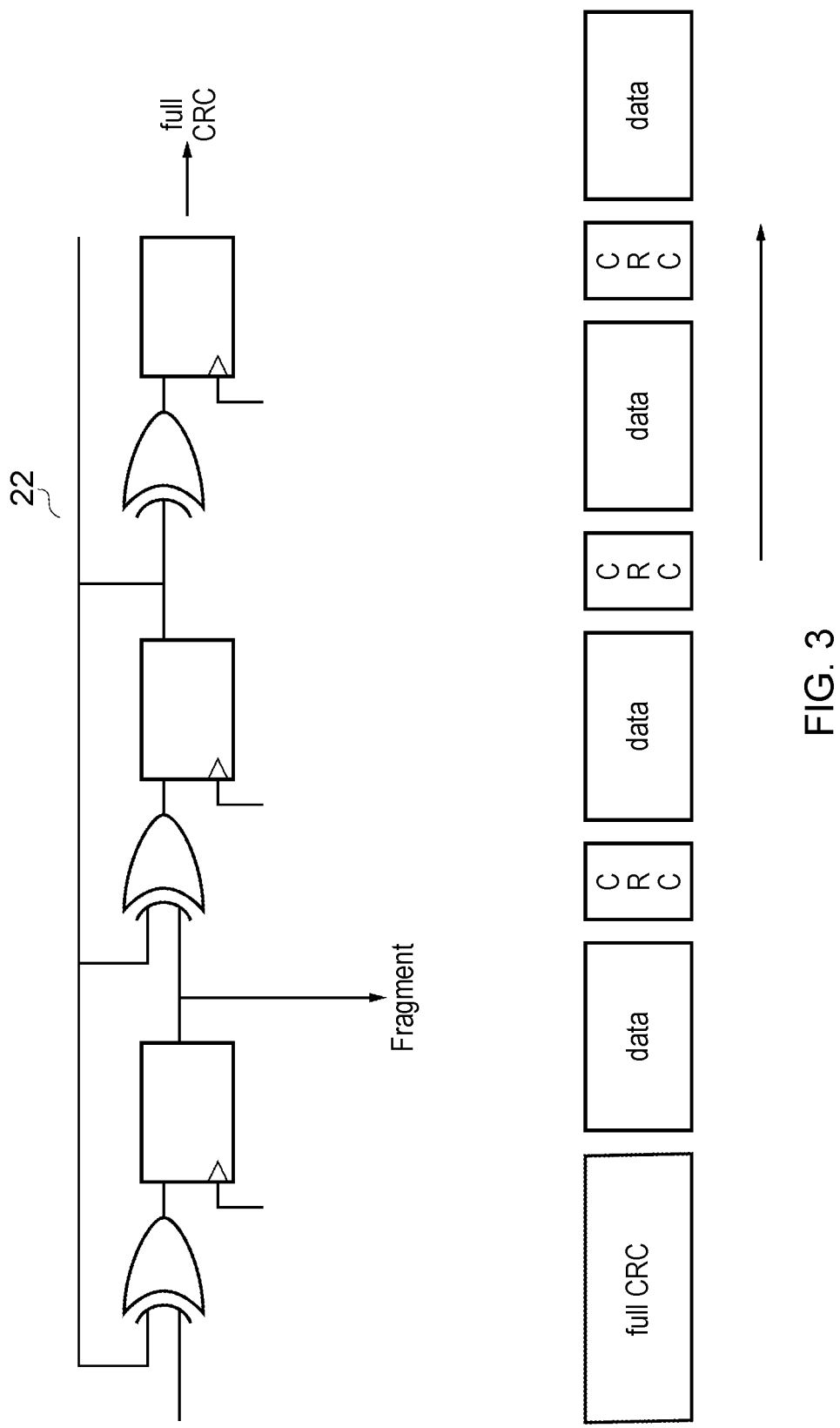
FIG. 3 shows polynomial generation circuitry for generating an error detection code according to an embodiment along with a stream of output data and cyclic redundancy code fragments.

FIG. 3 shows the CRC generation circuitry 22. This is a polynomial generation circuitry that generates a CRC in the form of a polynomial from the data that can be used to identify errors. The length of the circuitry and the positions of the feedback loops depend on the polynomial used and will be selected according to the error detecting capabilities required.

A fragment of the CRC code cumulatively calculated by this circuitry is output from near the input to the circuitry and it is that which is output with the data. The full CRC code is output by using the output of all the synchronous elements in parallel when all the data has passed through it. Thus, the CRC generation circuitry 22 will output the fragments and the full CRC. Multiplexer 24 will multiplex the fragments with the data in the case where the data and codes are being generated at the same device and will output the full CRC at the end. Thus, a stream of data and CRC fragments and then full CRC codes are output. For the case that the receiving apparatus generates and outputs the CRC codes, then these will be output interleaved in time with the received data.

Figure 4:
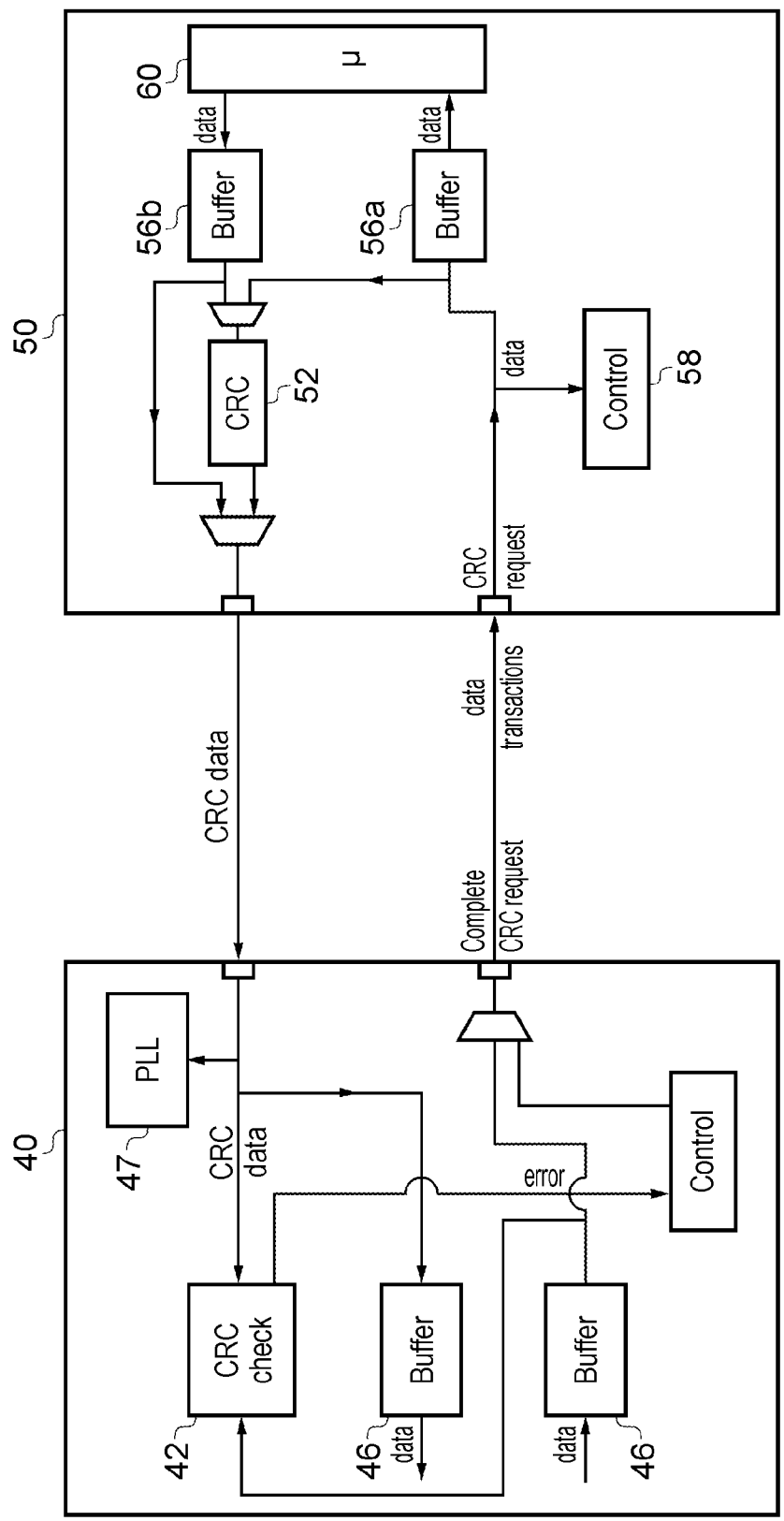
FIG. 4 shows a debugger and microprocessor being debugged according to an embodiment.

FIG. 4 shows a data processing system according to an embodiment. In this system, there is a debugger 40 which acts like the master in FIGS. 1 and 2 and a system to debug 50 which acts like the slave in FIGS. 1 and 2. Debugger 40 generates transactions which are transmitted to the target being debugged 50. The target comprises microprocessor 60 which is being debugged and also CRC generation circuitry 52, control circuitry 58 and buffers 56*a* and 56*b*. The CRC generation circuitry 52 is used to determine whether or not there are any errors in the transmitted test data. In this regard there is corresponding CRC check circuitry 42 within the debugger and control circuitry 48. There are also buffers 46.

In this embodiment, data which comprises a number of read and write transactions are transmitted from the debugger 40 to the system 50 to be debugged and in the case of a write the data received is stored within buffer 56*a*, while in the case of a read the data is stored in buffer 56*b* prior to being output. In this regard the read data is stored in buffer 56*b* in case the read fails, whereupon the read data can be requested again and sent from buffer 56*b*. Although they are shown as two buffers they can in some embodiments be implemented as a single buffer.

A CRC check is done on data to be transmitted in the case of a read and on the received data in the case of a write, and in this embodiment the fragments of the CRC code which are generated as a single bit are changed by CRC generation circuitry 52 into two bit data such that a one is represented in this case by a rising edge, and a zero by a falling edge. This data is output back to master 40 where it is input to the CRC check circuitry 42 to determine whether there are any errors in the data that has been transmitted.

This CRC data in the form of a clock edge is also input to a clock generator in the form of PLL circuitry 47 which generates a clock signal from the clock edges of the received data. In this way, the debugger 40 can remain synchronised with the debuggee without the need for a dedicated clock signal.

This circuitry acts in a very similar way to FIG. 2 thus, where an error is detected by CRC check circuitry 42 in write data, control circuitry 48 will indicate that error to the apparatus 50 by pausing its output of the data. The control circuitry 58 will react to the pause by flushing buffer 56*a*. Alternatively, if there is no pause in the data it will commit the oldest data from the buffer 56*a* when new data is received and this will be sent to microprocessor 60.

In the event that the transaction is a read then data will be read from microprocessor 60 and will be input via buffer 56*b* to the CRC generation circuitry 52 and the CRC fragments in the form of the clock edges will be output interspersed with this data. The received data is stored in buffer 46. This received data is checked by the CRC check circuitry 42 and any errors will be indicated to control circuitry 48 which will flush buffer 46 in response to these errors and re-transmit a read request. It may prior to this transmit a request to read a status register (not shown) in the system 50 to determine whether the error detected was not a transmission error but a fault.

Figure 5:
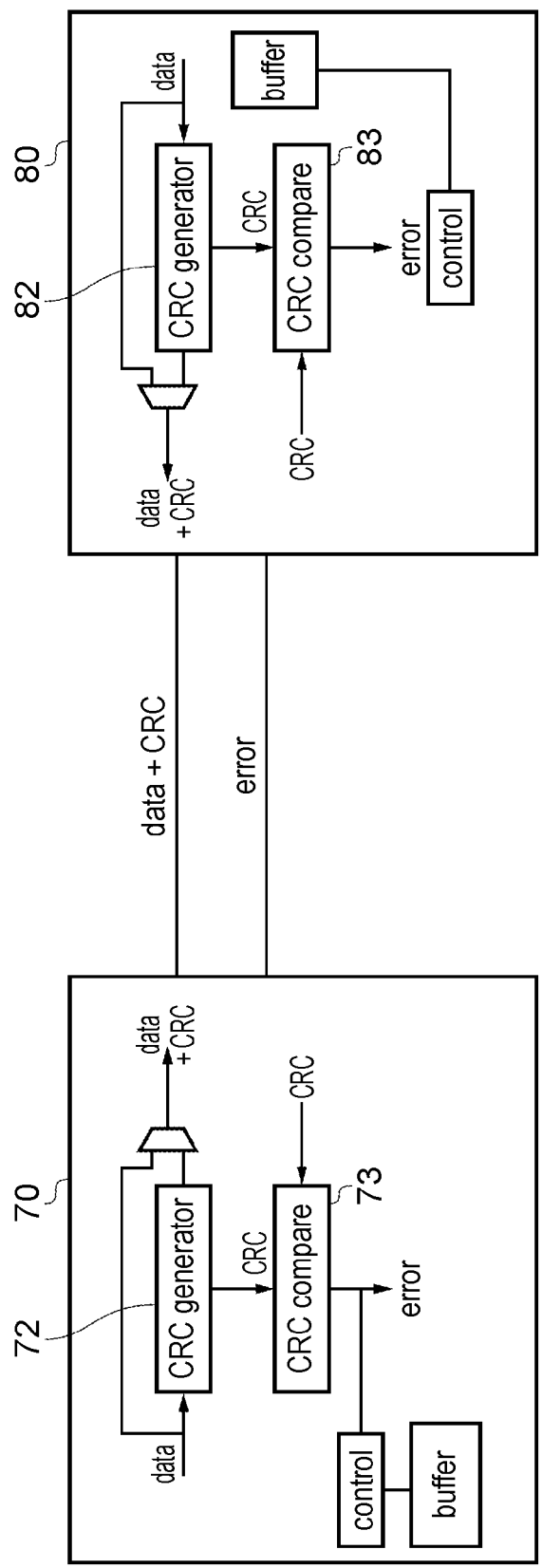
FIG. 5 shows a data processing system according to an alternative embodiment.

FIG. 5 shows an alternative embodiment where the two apparatus 70 and 80 that are linked each comprise CRC generators 72 and 82 respectively and CRC check circuitries 73 and 83 respectively. In this case, each of the apparatus 70, 80 can act as either a master or a slave and can generate write or read requests. These apparatus are configured such that the device that is transmitting the data will also transmit the CRC fragments interspersed within the data and the receiving circuitry will check them and will signal any errors. Thus, where a write request is sent from apparatus 70 the data will be sent data interspersed with CRC fragments. The received data will be buffered within apparatus 80 while the data is checked by the CRC compare circuitry 83. In response to not finding errors after a predetermined number of data portions then the oldest data in the buffer will be committed and when the full CRC code is sent at the end of the data write the whole data buffer can be committed. In response to finding an error in the data the buffer is flushed.

If apparatus 70 is performing a read request then the data and the CRC codes will be sent from apparatus 80 and will be compared at apparatus 70. The data will be buffered prior to being committed within the data buffer in apparatus 70 and if the compare circuitry 73 determines that the CRC codes that the CRC generator 72 generates do not match those that are received then it will flush the buffer and will signal an error in the form of a new read request. If however, no errors are detected, a full CRC code will be transmitted at the end of the data and in response to this the data in the buffer within apparatus 70 can be committed and flushed. During a read request from apparatus 70 the data that has been read will be stored in the buffer in apparatus 80 and if there is an error and a new read request is sent this data will be sent from this buffer. This may be important where a read of a data value may change its value as sometimes occurs. In such a case, it is important to buffer the data that has been read so that if the transmission fails the same data can be sent again. In the case where apparatus 80 does not store data in this way then such a buffer would not be required as the read could simply be repeated.

Figure 6:
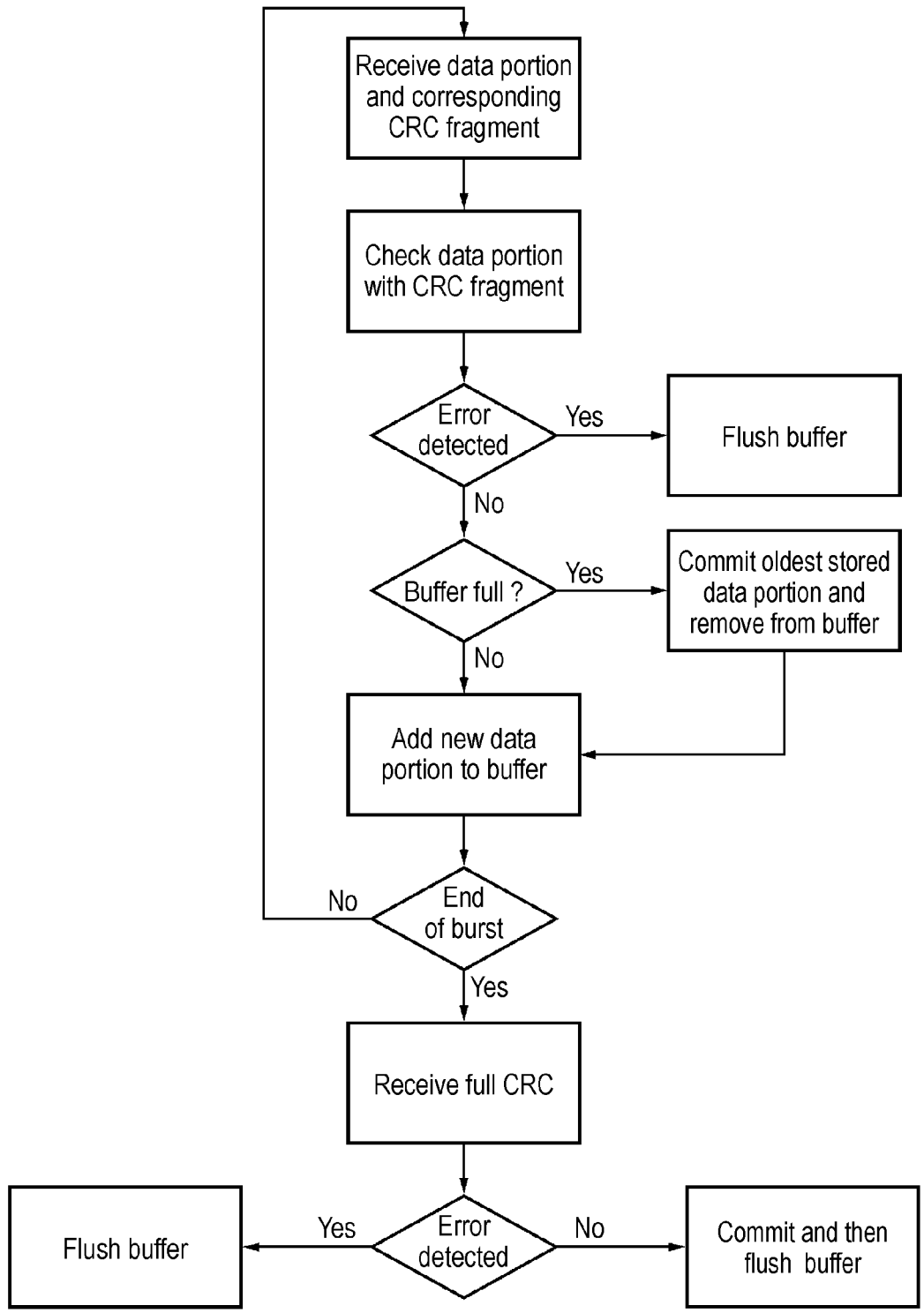
FIG. 6 shows a flow diagram illustrating a method of an embodiment where the CRC code is output with the data.

FIG. 6 shows a flow diagram illustrating steps in a method according to one embodiment. This method is the method which occurs when in response to a read request in the apparatus of FIG. 1 or 2, or in response to any request in FIG. 5.

Initially data is transmitted and the CRC algorithm is applied to the data and the data is output as a data burst which comprises a stream of data portions interspersed with fragments of CRC codes. The full CRC code is output at the end of the burst of data. In this regard, if the transaction was not successful then this can be indicated to the device that is receiving the data by generating an invalid CRC code. In response to this the receiving apparatus will recognise that there is an error.

The receiving apparatus receives the data stream which comprises the data portions and the CRC fragments. It then verifies the received data portion using the received CRC fragment and the CRC fragment that it generates itself and determines whether there is an error. If there is then the buffer is flushed. If there isn't then it determines whether the buffer is full. If it isn't then it stores the data portion in the buffer. If the buffer is full then it will commit the oldest stored data portion from the buffer and remove it and then store the data portion in the buffer. If the end of the burst has not been reached then the process is repeated to receive the next data portion and CRC fragment. If the end of the burst has been reached the full CRC code is received. If it is correct it will commit the buffer and then flush it. If it is not correct then an error has occurred and it will flush the buffer.

Figure 7:
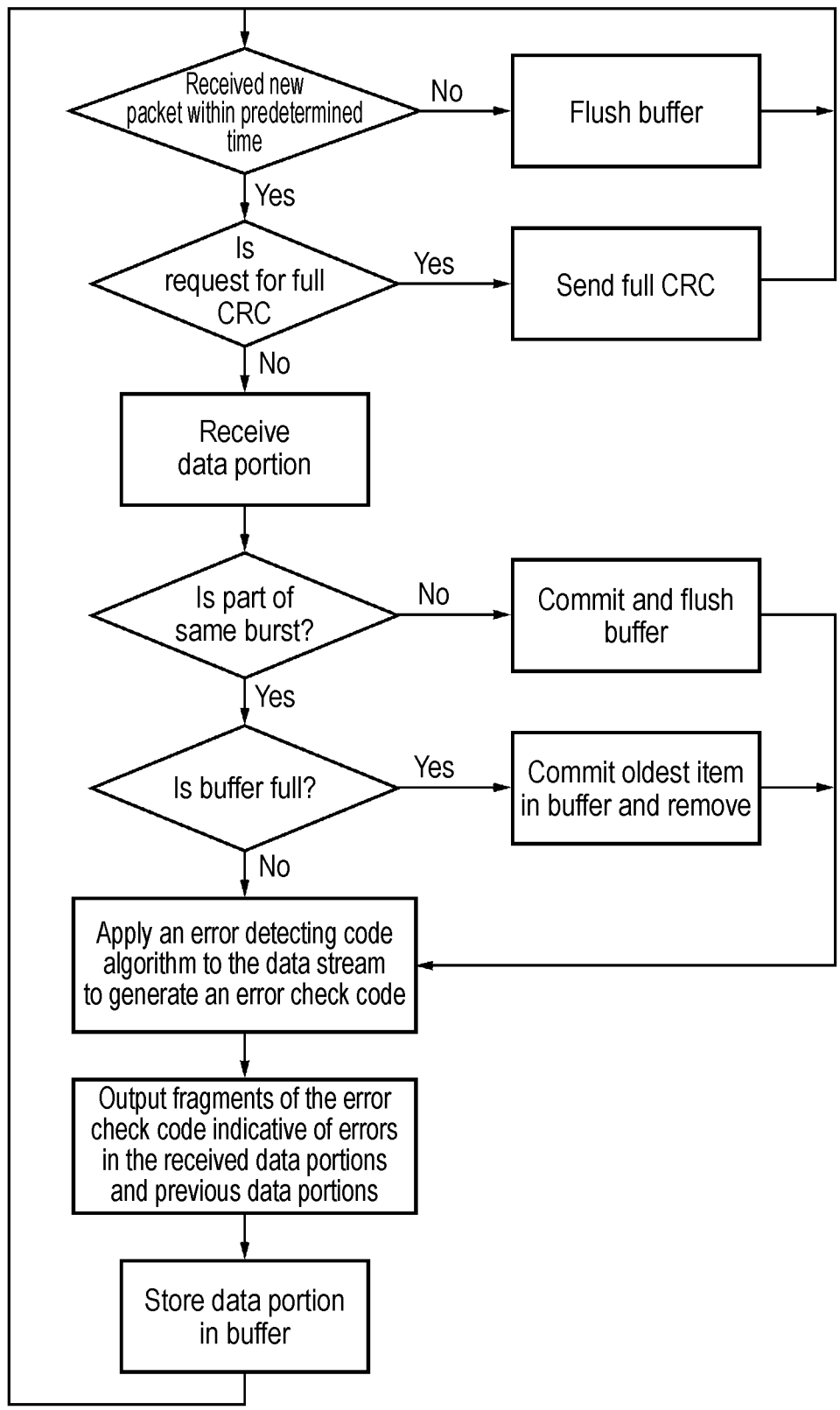
FIG. 7 shows a flow diagram illustrating a method of an embodiment where the error detecting code is generated at the data receiver and is transmitted back to the data transmitter.

FIG. 7 shows a flow diagram illustrating steps in a further method and this relates to a write for FIG. 1 or 2. In this case it is determined if a new packet has been received within a predetermined time. If it hasn't then this an indication from the transmitter that there is an error in the previous burst and the buffer is flushed. This is a convenient way of indicating an error that does not require any additional signals to be encoded. If a new packet has been received it is determined if it is a request for the full CRC, in which case the full CRC is transmitted. Otherwise the packet will contain a new data portion.

If a new data portion has been received then it is determined whether it is part of the same data burst. If it is and if the buffer is full the oldest data portion stored there is committed.

If the new data portion is not part of the same burst then the contents of the buffer must be committed and the buffer can be flushed.

As the data portions are processed, an error detecting code algorithm is applied to the data portions of the data stream to generate error check codes, and a fragment of the error check code is output which is indicative of errors in the data portion that has just been received and any earlier data portions within the same burst.

The fragment of error check code that is calculated from that data portion is then output and the data portion stored to the buffer. It is then determined again if a new data portion is received within the predetermined time.

It should be noted that as the device that receives the data is generating the error correction codes and transmitting them any errors in the codes are detected by the device that has sent the data and therefore need to be signalled in some way. In this embodiment they are signalled by a pause in the data received. Thus, each new data portion that is received within the predetermined time indicates that no error has been detected and thus, after a certain number of portions the data within the buffer can be committed as one can be reasonably certain that there are no errors in it.

Furthermore, if the device detects a fault in the committing data from the buffer for example, such that it cannot receive the data transmitted then it can generate a false CRC code and can store an indication of the fault in a status register. These steps are also not shown. The transmitter may generate a read request to read the status register in response to detecting an error in a received CRC code.

Various further aspects and features of the present invention are defined in the appended claims. Various modifications can be made to the embodiments herein before described without departing from the scope of the present invention.

The invention claimed is:

1. Circuitry for providing error check values for indicating errors in data portions within a data stream comprising:
    error detecting code generation circuitry configured to apply an error detecting code algorithm to said data stream and to thereby generate and periodically update a multi-bit check value as said data stream is processed, each update of said multi-bit check value being indicative of said error detecting code generation circuitry receiving a further item of said data stream;
    an output for periodically outputting a fragment of said multi-bit check value from said error detecting code generation circuitry during said processing of said data stream, said fragments output each corresponding to a data portion of said data stream; wherein:
    each of said fragments of said multi-bit check value provides a value indicative of an error occurring either in said corresponding portion of said data stream or in an earlier portion of said data stream;
    said data stream comprises a burst of data; and
    said error detecting code generation circuitry is configured to output said complete multi-bit check value having processed said burst of data.

2. Circuitry according to claim 1, wherein said data stream is input to said error detecting code generation circuitry, said input data stream comprises a serial stream comprising said data portions, one data portion being input directly after a previous data portion in said data stream.

3. Circuitry according to claim 1, wherein said error detecting code algorithm is a cyclic redundancy check algorithm, and said error detecting code generation circuitry is cyclic redundancy check generation circuitry.

4. Circuitry according to claim 1, wherein said fragment comprises a single bit.

5. Circuitry according to claim 1, wherein said error detecting code generation circuitry, comprises serially connected synchronous logic circuits configured to process said data stream, said error detecting code generation circuitry further comprising a data input configured to receive said data stream and at least one feedback circuitry, said feedback circuitry being configured to feedback a value output from one of said serially connected synchronous logic circuits to an input of at least one of said serially connected synchronous logic circuits closer to said data input such that said value is combined with said data stream during said processing, said fragment being output from an output of at least one of said serially connected synchronous logic circuits.

6. A data processing apparatus comprising circuitry according to claim 1 and an input port configured to receive data comprising said data stream and an output port, wherein said data processing apparatus is configured in response to receipt of said data stream at said input port to generate said fragments of said multi-bit check value and to output said fragments of said multi-bit check value at said output port.

7. A data processing apparatus according to claim 6, wherein said data processing apparatus further comprises:
    buffer circuitry configured to store said data portions of said data stream; and
    control circuitry configured to commit a least recently received stored data portion in response to receiving a further data portion.

8. A data processing apparatus according to claim 7, wherein said control circuitry is configured to vary a number of data portions that are stored in said buffer at any one time in dependence upon a desired error detection capability.

9. A data processing apparatus according to claim 7, said control circuitry being configured to respond to receipt of an error indication received at said input port to flush said buffer circuitry of said stored data portions.

10. A data processing apparatus according to claim 9, wherein said data stream is received at said input port from a data interface, and said error indication comprises no activity on said data interface for a predetermined time.

11. A data processing system comprising a data processing apparatus according to claim 10, and a further data processing apparatus configured to output said data stream to said data processing apparatus wherein said further data processing apparatus is configured to receive said fragments of said multi-bit check value and in response to detecting an error to provide an indication of said error, wherein said further data processing apparatus is configured to provide said indication of said error by pausing output of said data stream for a predetermined time.

12. A data processing apparatus according to claim 7, said control circuitry being configured to respond to receipt of an acknowledgement indication received at said input port to commit and flush said buffer circuitry of said stored data portions.

13. A data processing apparatus according to claim 12, wherein said data stream comprises a burst of data and said acknowledgement indication comprises receiving a further burst of data on said input.

14. A data processing apparatus according to claim 6, said circuitry being configured to identify, when a data item is received at said input port, a request for said complete multi-bit value from an indicator associated with said data item and to respond to said request by outputting said complete multi-bit check value.

15. A data processing apparatus according to claim 6, wherein said data processing apparatus is configured to control said circuitry to output an incorrect fragment of said multi-bit check value in response to an error processing at least a portion of said data stream.

16. A data processing apparatus according to claim 6, wherein said input port is further configured to receive data transactions and said output port is further configured to output a stream of data comprising said data stream and said fragments of said multi-bit check values and said multi-bit check value in response to one of said data transactions.

17. A data processing apparatus according to claim 16, wherein said data processing apparatus is configured to output said data stream, said output data stream comprising a plurality of said data portions interspersed by said corresponding fragments of said multi-bit check value and followed by said multi-bit check value.

18. A data processing apparatus according to claim 6, wherein said fragment of said multi-bit check value comprises a single bit value, said data processing apparatus comprising output circuitry configured to generate a two bit value from said single bit prior to outputting said fragment, said two bit value comprising two bits each having a different value and having either a rising or falling edge between said two bits, said rising or falling edge being synchronised with a clock signal clocking said data processing apparatus.

19. A data processing system comprising a data processing apparatus according to claim 18, and a further data processing apparatus configured to output said data stream to said data processing apparatus wherein said further data processing apparatus is configured to receive said fragments of said multi-bit check value and in response to detecting an error to provide an indication of said error, wherein said further data processing apparatus comprises a clock generator for generating a clock signal from a received clock signal, wherein said fragments of said multi-bit check value that are received each comprise a two bit value having two different bits and either a rising or falling edge between said two bits, said clock generator being configured to adjust said clock signal to synchronise said clock signal with at least some of said rising or falling edges.

20. A data processing system comprising a data processing apparatus according to claim 6, and a further data processing apparatus configured to output said data stream to said data processing apparatus wherein said further data processing apparatus is configured to receive said fragments of said multi-bit check value and in response to detecting an error to provide an indication of said error.

21. A data processing system according to claim 20, wherein said further data processing apparatus is configured to output a request for said complete multi-bit check value, following output of said plurality of data portions, said request comprising a indicator indicating said request.

22. A data processing system according to claim 20, said further data processing apparatus being configured to output a read request to read a status register of said target device in response to detecting an error in said received fragments of said multi-bit check value.

23. A data processing system according to claim 20, wherein said further data processing apparatus comprises a debugging apparatus and said data processing apparatus comprises a microprocessor to be debugged.

24. A data processing apparatus comprising circuitry according to claim 1, and further comprising:
an output port configured to output a stream of data comprising said data stream and said fragments of said multi-bit check values and said multi-bit check value.

25. A data processing apparatus according to claim 24, wherein said data processing apparatus is configured to output said data stream, said output data stream comprising a plurality of said portions of said data stream interspersed by said corresponding fragments of said multi-bit check value and followed by said multi-bit check value.

26. A data processing system comprising a data processing apparatus according to claim 24 and a further data processing apparatus in communication with said data processing apparatus and comprising an input port for receiving said data stream and said multi-bit check value and error detecting circuitry configured to check for errors in said received data stream in dependence upon said data stream and said fragments of said multi-bit check value and in response to detecting an error providing an error indication to said data processing apparatus.

27. A data processing system according to claim 26, wherein said further data processing apparatus comprises:
buffer circuitry configured to store said data portions of said data stream; and
control circuitry configured to commit a least recently received stored data portion in response to receiving a further data portion.

28. A data processing system according to claim 27, wherein said control circuitry is configured to vary a number of data portions that are stored in said buffer at any one time in dependence upon a desired error detection capability.

29. A data processing system according to claim 27, said control circuitry being configured to respond to receipt of an acknowledgement indication received at said input port to commit and flush said buffer circuitry of said stored data portions.

30. A data processing system according to claim 29, wherein said data stream comprises a burst of data and said acknowledgement indication comprises receiving a further burst of data on said input port.

31. A method for providing error check values for indicating errors in data portions within a data stream including a burst of data, comprising the steps of:
generating an error detecting code by processing said data stream by applying an error detecting code algorithm to said data stream and thereby generating and periodically updating a multi-bit check value as said data stream is processed, each update of said multi-bit check value being indicative of said error detecting code algorithm being applied to a further item of said data stream;

periodically outputting a fragment of said multi-bit check value during said processing of said data stream, said fragments output each corresponding to a data portion of said data stream;

wherein each of said fragments of said multi-bit check value provides a value indicative of an error occurring either in said corresponding portion of said data stream or in an earlier portion of said data stream, outputting said complete multi-bit check value having processed said burst of data.

32. A method according to claim 31, wherein said data stream comprises a serial stream comprising said data portions, and said method comprises applying said algorithm to said serial data stream as consecutive ones of said data portions.

33. A method according to claim 31, wherein said error detecting code algorithm is a cyclic redundancy check algorithm.

34. A computer program product comprising a computer program operable when executed by a data processing apparatus to control said data processing apparatus to perform steps in a method according to claim 31.

* * * * *